United States Patent [19]
Shin

[11] Patent Number: 5,825,449
[45] Date of Patent: Oct. 20, 1998

[54] LIQUID CRYSTAL DISPLAY DEVICE AND METHOD OF MANUFACTURING THE SAME

[75] Inventor: Woo Sup Shin, Kyungsangbuk-do, Rep. of Korea

[73] Assignee: LG Electronics, Inc., Seoul, Rep. of Korea

[21] Appl. No.: 781,188

[22] Filed: Jan. 10, 1997

Related U.S. Application Data

[62] Division of Ser. No. 616,291, Mar. 15, 1996.

[30] Foreign Application Priority Data

Aug. 19, 1995 [KR] Rep. of Korea .................. 25538/1995

[51] Int. Cl.⁶ .................. G02F 1/136; G02F 1/1343; G02F 1/1345
[52] U.S. Cl. .................. 349/148; 349/149; 349/43
[58] Field of Search .................. 349/149, 148, 349/43, 139, 152, 147

[56] References Cited

U.S. PATENT DOCUMENTS

| | | |
|---|---|---|
| 3,902,790 | 9/1975 | Hsieh et al. . |
| 5,162,933 | 11/1992 | Kakuda et al. .................. 349/43 |
| 5,187,604 | 2/1993 | Taniguchi et al. .................. 349/42 |
| 5,233,448 | 8/1993 | Wu . |
| 5,397,719 | 3/1995 | Kim et al. . |
| 5,650,636 | 7/1997 | Takemura et al. .................. 349/42 |

FOREIGN PATENT DOCUMENTS

| | | |
|---|---|---|
| 0 090 988 | 10/1983 | European Pat. Off. . |
| 0 312 389 | 4/1984 | European Pat. Off. . |
| 0 587 144 | 3/1994 | European Pat. Off. . |
| 0 620 473 | 10/1994 | European Pat. Off. . |

*Primary Examiner*—William L. Sikes
*Assistant Examiner*—Tiep H. Nguyen
*Attorney, Agent, or Firm*—Finnegan, Henderson, Farabow, Garrett & Dunner, L.L.P.

[57] ABSTRACT

A method for fabricating a liquid crystal display is disclosed whereby a source and gate are exposed after the step of forming a passivation layer. As a result, the number of processing steps is reduced and yield is improved.

11 Claims, 5 Drawing Sheets

LIQUID CRYSTAL DISPLAY DEVICE AND METHOD OF MANUFACTURING THE SAME

This is a continuation of application Ser. No. 08/616,291, Filed Mar. 15, 1996.

BACKGROUND OF THE INVENTION

The present invention relates to a liquid crystal display (LCD) device and a method of manufacturing the same, and more particularly, to a liquid crystal display device having a combined source electrode and source pad structure.

Active matrix thin film displays include thin film transistors (TFTs) for driving the liquid crystal material in individual pixels of the display. As shown in FIG. 6, a conventional LCD includes an array of pixels each having liquid crystal material (not shown) sandwiched between a common electrode provided on a top plate (not shown) and a pixel electrode 6 disposed on a bottom plate. The bottom plate further includes a plurality of gate lines 600 intersecting a plurality of data lines 610.

Thin film transistors 620, serving as active devices, are located at intersecting portions of gate lines 600 and data lines 610. Gate lines 600 and data lines 610 are connected to the gates and sources, respectively of thin film transistors 620. In addition, pixel electrodes 6 are connected to respective drain electrodes of thin film transistors 620. Gate Pads 630 and Data Pads 640 are connected to the gate lines and data lines to receive datas from gate driver and data driver respectively.

A conventional method of manufacturing a liquid crystal display device including TFT driving elements will be described with reference to FIGS. 1a–1f.

As shown in FIG. 1a, a conductive layer is formed on a transparent glass substrate 1 and patterned to form gate 2, storage capacitor electrode 2D, source pad 2A, and gate pad 2B. Gate pad 2B is used for receiving a voltage to drive and active layer in the completed TFT device.

As shown in FIG. 1b, a gate insulating film 3, such as a nitride film or an oxide film, is formed on the entire surface of the substrate in order to electrically insulate gate 2. An amorphous silicon active layer 4 is formed on a portion of gate insulating film 3 overlying gate 2. Then, in order to reduce the contact resistance between the active layer and the source/drain regions in the completed device, and appropriately doped semiconductor layer 5 is formed on amorphous silicon layer 4 as an ohmic contact layer. Doped semiconductor layer 5 and amorphous silicon layer 4 are then etched in accordance with a predetermined active layer pattern.

Since a pad wiring layer is necessary in order to communicate information from an external driving circuit to the gate and source, a gate insulating film 3 is selectively etched to expose source pad 2A and gate pad 2B (see FIG. 1c). Next, as shown in FIG. 1d, a transparent conductive layer (ITO) is deposited on the entire surface of the substrate and patterned to form a pixel electrode 6, which is formed on a portion of the display pixel, while ITO patterns 6A and 6B are formed on source pad 2A and gate pad 2B, respectively.

As shown in FIG. 1e, the TFT is formed on the active layer and includes a conductive layer deposited on the substrate and simultaneously patterned to form source and drain electrodes 7 and 8, respectively. Source electrode 7 is connected to source pad 2A, and drain electrode 8 is contact with impurity-doped semiconductor layer 5 and pixel electrode 6. In the completed device structure, source electrode 7 conducts a data signal, received from a data wiring layer and drain electrode 8, to pixel electrode 6. The signal is stored in the form of charge on pixel electrode 6, thereby driving the liquid crystal.

As shown in FIG. 1f, a nitride film is deposited on the entire surface of the substrate as a passivation layer 9 in order to seal the underlying device from moisture and to prevent absorption of impurities. Passivation layer 9 is selectively etched to expose source-pad 2A and gate pad 2B, thereby completing the TFT.

In the conventional method described above, The source electrode 7 and pixel electrode 6 provided on the same surface of gate insulating film 3. Accordingly, processing errors can cause these electrodes to contact each other. As a result, shorts can occur, thereby reducing yields.

Further, since the source pad for the source wiring is composed of the same material as the gate, its contact resistance with the underlying source electrode can be high. In addition, at least six masking steps are required as follows: patterning the gate, storage capacitor electrode, source pad and gate pad; forming the active layer pattern; patterning the gate insulating film for exposing the pad part; forming the pixel electrode; forming the source and drain electrode; and patterning the passivation film for exposing the pad part. Thus, the conventional process requires an excessive number of fabrication steps which increase cost and further reduce yield.

SUMMARY OF THE INVENTION

In order to solve the aforementioned problems, it is an objective of the present invention to provide a liquid crystal display device and a method of manufacturing the same, in which processing errors can be prevented and the Yield can be increased by etching the gate insulating film after the step of forming the passivation layer.

To accomplish this objective of the present invention, there is provided a liquid crystal display device comprising a substrate; a gate electrode; a gate pad and a source pad formed on the substrate as a first conductive layer; a gate insulating film formed on the entire surface of the substrate; a semiconductor layer and an impurity-doped semiconductor layer formed on the gate insulating film above the gate electrode; a source electrode and a drain electrode formed on the semiconductor layer; a passivation layer formed on the entire surface of the substrate; a first contact hole exposing the source pad; a second contact hole exposing a portion of the drain electrode; a third contact hole exposing the gate pad portion; and a fourth contact hole exposing the source electrode, the contact holes being formed by etching the passivation layer and gate insulating film; a pixel electrode connected with the drain electrode through the second contact hole; and a transparent conductive layer connecting the source pad with the source electrode through the first contact hole and fourth contact hole.

To further accomplish the objective of the present invention, there is also provided a method of manufacturing a liquid crystal display device, comprising the steps of forming a first conductive layer on a substrate; patterning the first conductive layer to respectively form a gate electrode, a gate pad and a source pad; sequentially forming an insulating film, a semiconductor layer and an impurity-doped semiconductor layer on the entire surface of the substrate; patterning the impurity-doped semiconductor layer and semiconductor layer to an active pattern; forming a second conductive layer on the entire surface of the substrate; patterning the second conductive layer to form a source electrode and a drain electrode; forming a passivation film on the entire surface of the substrate; Selectively etching the passivation film and insulting film to respectively form a first contact hole exposing the source pad, a second contact hole exposing a portion of the drain electrode, a third contact hole exposing a gate pad portion, and a fourth contact hole exposing a portion of the source electrode; forming a transparent conductive layer on the entire surface of the substrate; and patterning a pixel electrode connected with the drain electrode through the second contact hole, a transparent conductive layer connected with the gate pad through the third contact hole, and a transparent conductive layer connecting the source pad with the source electrode through the first and fourth contact holes.

BRIEF DESCRIPTION OF THE ATTACHED DRAWINGS

DETAILED DESCRIPTION OF THE INVENTION

Hereinafter, preferred embodiments of the present invention will be described with reference to the attached drawings.

Figure 1A:
FIG. 1a to 1f are cross-sectional views illustrating steps of a conventional method for manufacturing a liquid crystal display device.
Figure 1B:
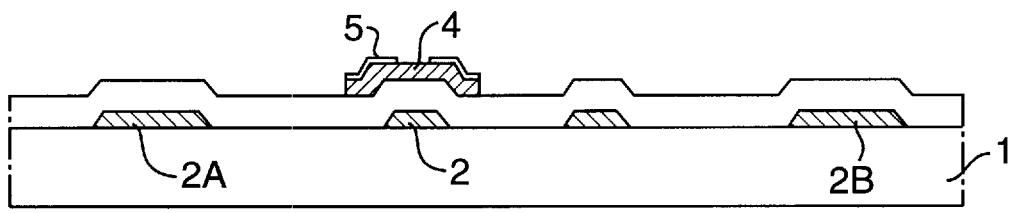
Figure 1C:
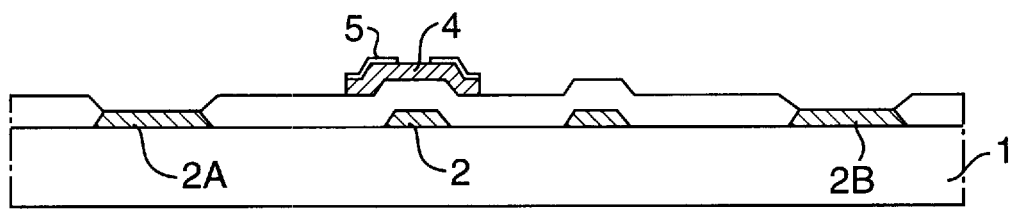
Figure 1D:
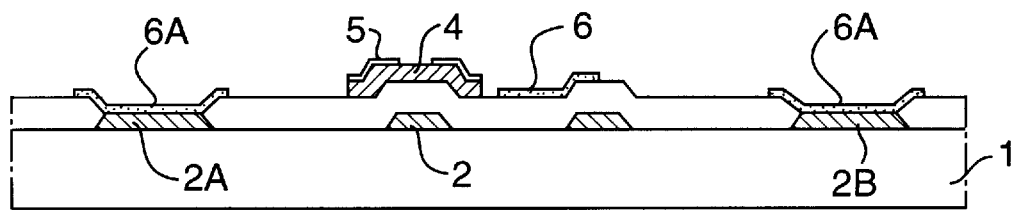
Figure 1E:
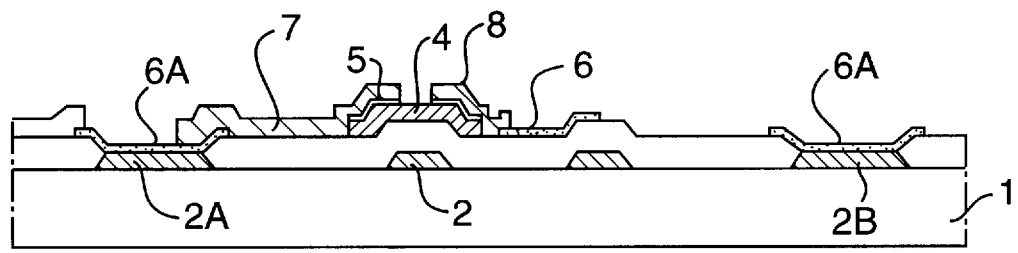
Figure 1F:
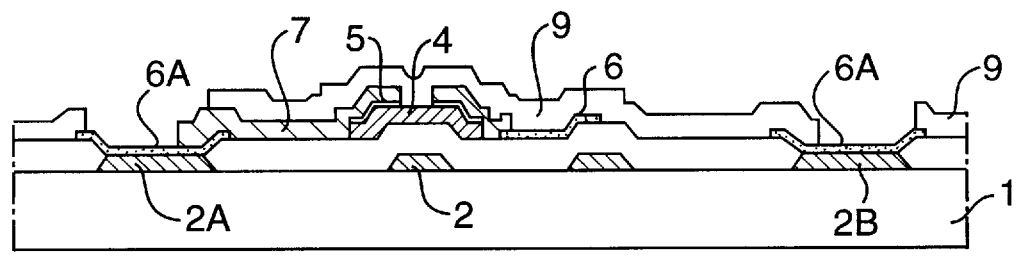
Figure 2A:
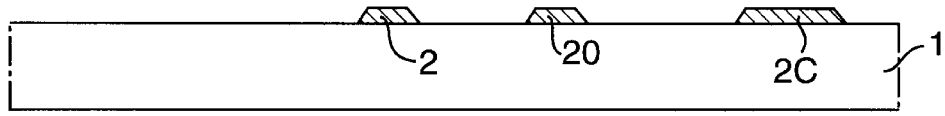
FIGS. 2a to 2e are cross-sectional views illustrating steps of a method for manufacturing a liquid crystal display according to a preferred embodiment of the present invention.

Referring first to FIG. 2a, a conductive layer is formed on a transparent glass substrate 1 and patterned to form a gate electrode 2, a storage capacitor electrode 2D, and a gate pad 2C, all of the same material. The gate electrode is used for applying a voltage in order to drive the active layer in the completed TFT device.

Figure 2B:
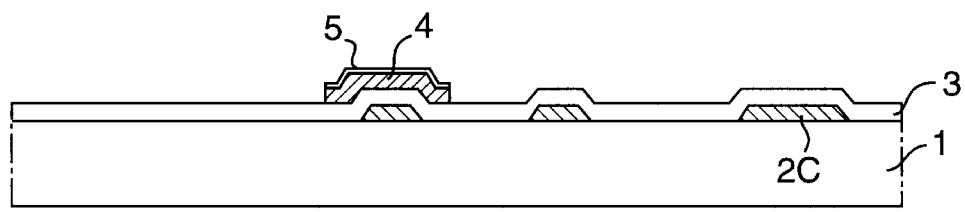

As shown in FIG. 2b, a gate insulating film 3 such as a nitride film or an oxide film is formed on the entire surface of the substrate in order to electrically insulate gate 2. Semiconductor active layer 4 is then formed on insulating gate 2. Active layer 4 is preferably made of amorphous silicon layer deposited by a chemical vapor deposition (CVD) process. Then, in order to reduce the contact resistance between the active layer and the subsequently formed source and drain, an impurity-doped semiconductor layer 5 is formed on amorphous silicon layer 4, as an ohmic contact layer. Impurity-doped semiconductor layer 5 and amorphous silicon layer 4 are etched according to a predetermined active layer pattern.

Figure 2C:
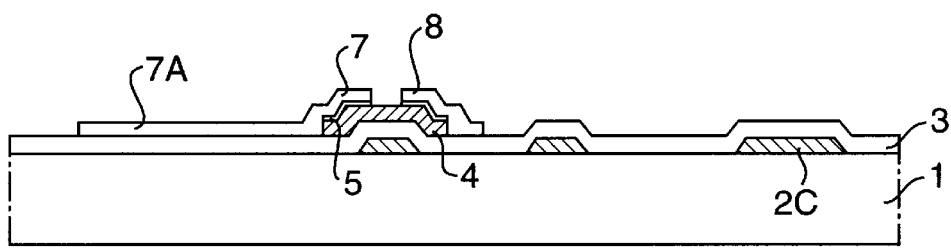

As shown in FIG. 2c, a conductive layer for forming source electrode 7 and drain electrode 8 is deposited on the substrate by patterning a sputtered layer of conductive material. Using the source and drain electrodes as masks, portions of the impurity-doped semiconductor layer 5 are exposed and then etched. Source electrode 7 thus forms part of a transistor region and serves as source pad 7A above the gate insulating film so that the same conductive layer constitutes part of the source wiring and the source electrode of the TFT.

Figure 2D:
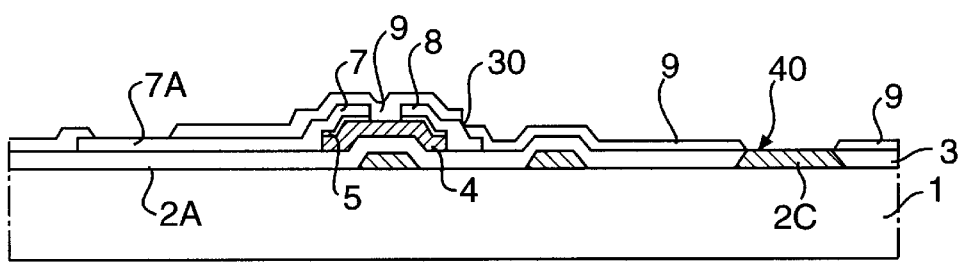

As shown in FIG. 2d, a passivation layer 9, e.g., a nitride film, is deposited on the entire surface of the substrate by a CVD process. Then, a predetermined portion of passivation layer 9 and gate insulating film 3 are selectively etched to form first, second and third contact holes 20, 30 and 40, thereby exposing a predetermined region of source pad 7A above gate insulating film 3, a predetermined region of drain electrode 8, and a predetermined region of gate pad 2C. For external electrical connections It is necessary to exposed pads 7A and 2C.

Figure 2E:
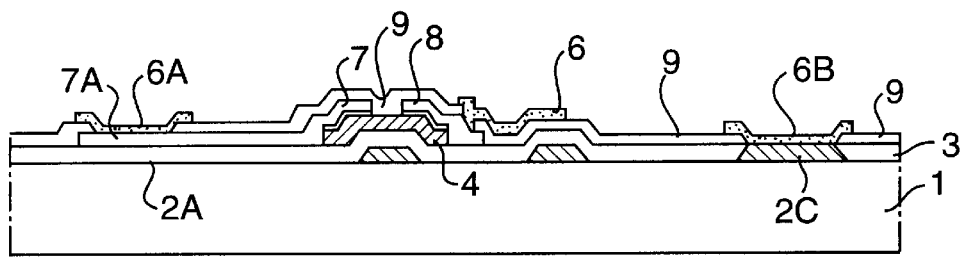

As shown in FIG. 2e, an indium tin oxide (ITO) layer is next deposited on the substrate by sputtering or a CVD process and etched according to a predetermined pattern to form a pixel electrode 6. As further shown in FIG. 2e, pixel electrode 6 is connected to the upper portion of drain electrode 8 At the same time, ITO pattern 6B is formed on gate pad 2C. In addition, ITO pattern 6A is provided on source pad 2A, which is part of a data electrode of the LCD. The TFT of the present invention having electrical contacts or wiring structures including gate pad 2C, layer 6B and layer 6A, source pad 7A is thus completed.

As described above, the pixel electrode 6 is formed after the passivation process in the present invention. In contrast, pixel electrode 6 is formed after the pad process or the source/drain formation process in the conventional method. Thus, the passivation layer is interposed between the source/drain formation material and the pixel electrode, thereby effectively isolating these layers and preventing shorts.

Further, unlike the conventional process, the method in accordance with the present invention does not require the step of exposing the pad directly after depositing the gate insulating film, and the source and gate pads are exposed by etching during the passivation process. Thus, the pixel electrode, which is made of ITO, is formed on the source and gate pads. In addition, the source pad is not formed of gate material, but is formed from the source formation material, while the source and drain are deposited. Thus, the problem of high contact resistance between the source pad and the source, caused by forming the source pad from the gate material, can be avoided.

Figure 3:
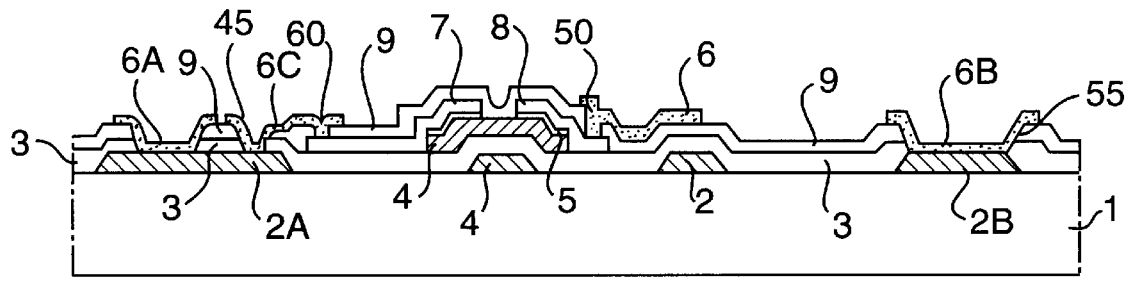
FIG. 3 is a cross-sectional view illustrating a liquid crystal display device structure according to a second embodiment of the present invention.

FIG. 3 illustrates a second embodiment of the present invention in which the step of etching the gate insulating layer and the step of etching the passivation layer to expose the pads are preformed in only one mask step. In particular, source pad 2A is composed of gate material, as in the conventional method, and is formed at the same time as gate 2, storage capacitor electrode 2D and gate pad 2B. After forming first, second, third and fourth contact holes 45, 50, 55 and 60, material for forming the pixel electrode is then deposited. As a result, since both the first (45) and fourth (60) contact holes are formed over source pad 2A (formed of the same material as the gate) and source electrode 7, respectively, the source electrode 7 and source pad 2A may be connected to each other in the same step that the pixel electrode is formed. Thus, after patterning, a first transparent conductive layer 6C connects source electrode 7 with source pad 2A, and a second transparent conductive layer 6 (i.e., the pixel electrode) is connected to drain electrode 8.

In other words, a conductive layer is formed on a transparent glass substrate 1 and patterned to form gate 2, a storage capacitor electrode 2D,. a source pad 2A and a gate pad 2B. After forming a gate insulating film 3 on the entire surface of the substrate, an amorphous silicon layer 4 and an impurity-doped semiconductor layer 5 are sequentially formed therson. These layers are then etched in accordance with a predetermined active layer pattern.

Then, a conductive layer is formed on the substrate and etched in accordance with a predetermined pattern, thereby forming a source electrode 7 and a drain electrode 8. After forming a passivation layer 9 on the entire surface of the substrate, passivation layer 9 and gate insulating film 3 are selectively etched, thereby forming a first contact hole exposing the source pad 2A and a third contact hole exposing the gate pad 2B. Since the passivation layer 9 and gate insulating film 3 are preferably etched in a single step, the sidewalls of the first and second contact holes are planar and smooth.

ITO is then deposited on the entire surface of the substrate and patterned to form a pixel electrode 6 connected to drain electrode 8 through the contact hole overlying drain electrode 8 in the pixel part. At the same time, ITO patterns 6A, 6B and 6C are formed to contact source pad 2A and gate pad 2B through the contact holes formed at gate insulating film 3 and passivation layer 9.

Figure 4:
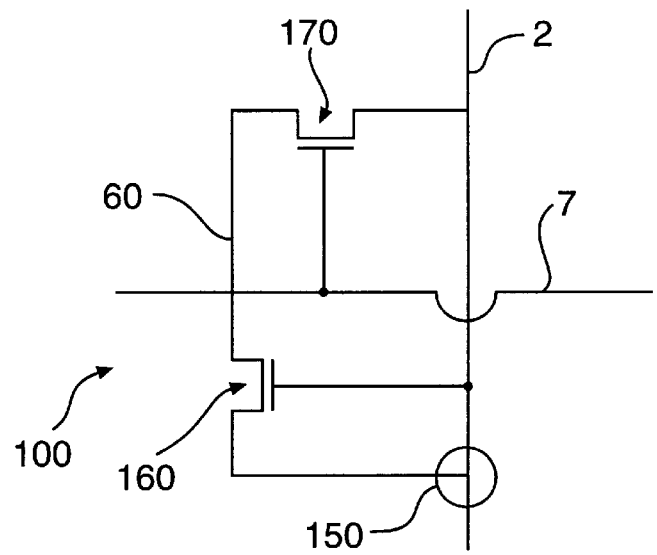
FIG. 4 is a circuit diagram of one example of a liquid crystal display device in which a gate material is connected with a source material in accordance with a third embodiment of the present invention.
Figure 5:
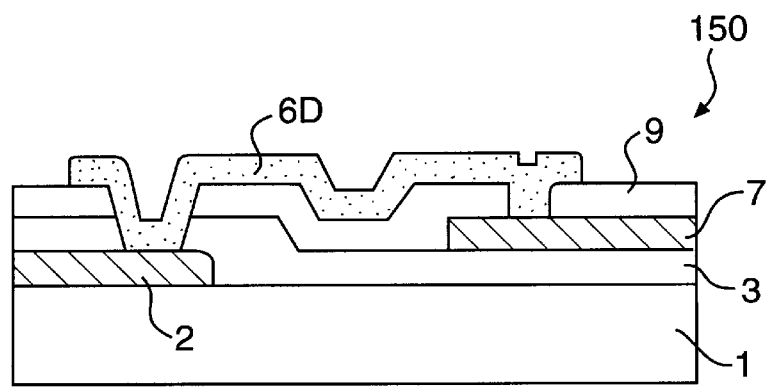
FIG. 5 is a vertical-cross-sectional view of the device shown in FIG. 4.
Figure 6:
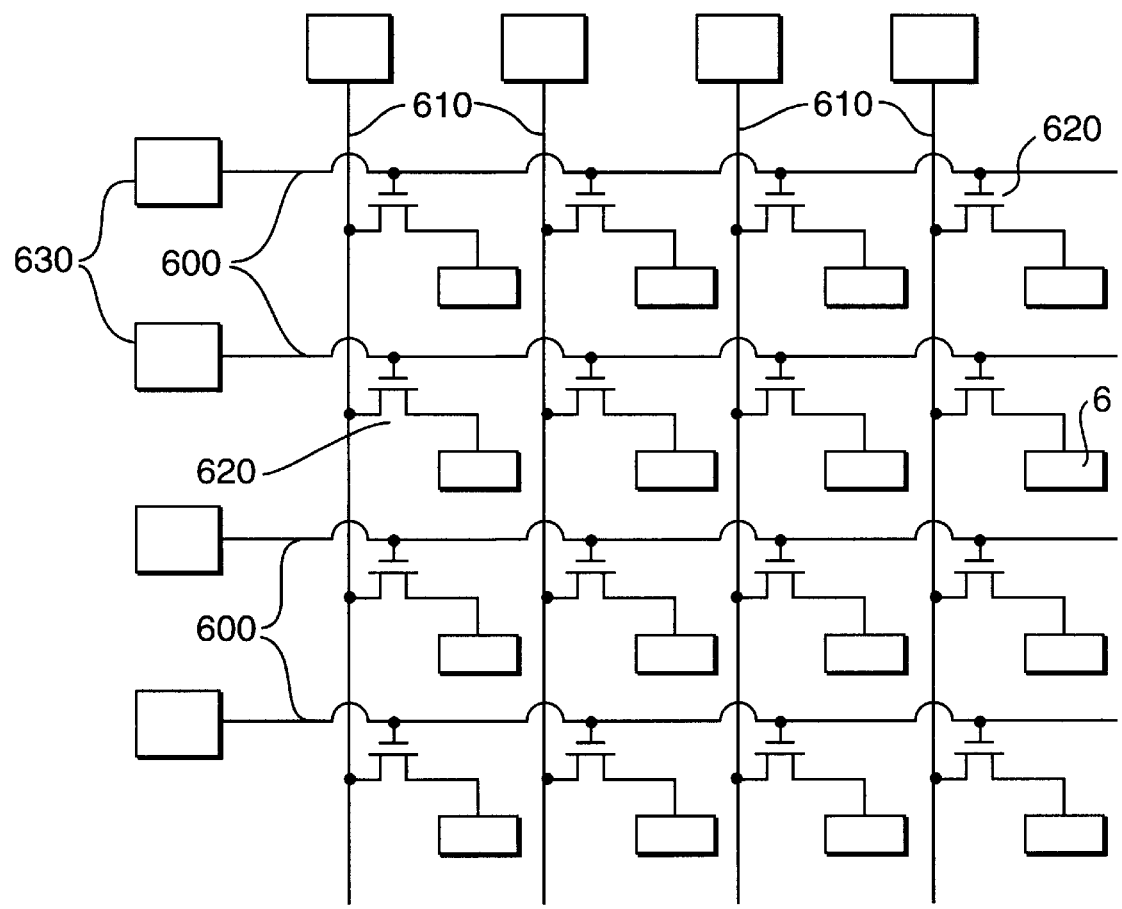
FIG. 6 is a plan view schematic representation of one prior embodiment of a matrix display.

Further, in accordance with an additional embodiment of the present invention, a repair line or static electricity protection circuit can also be provided during deposition of the pixel electrode layer. FIG.4 is a schematic diagram of static electricity protection circuit 100, and FIG.5 is an enlarged cross-sectional view of a portion 150,of the circuit.

In the circuit shown in FIG.4. if a high potential due to an electrostatic discharge is present on source electrode 7, for example, transistor 170 is rendered conductive to discharge source electrode 7 to gate line 2. Similarly, gate line 2 can discharge to source electrode 7 via transistor 160. As shown in FIG.5, the connection between gate line 2 and source electrode 7 is achieved by forming contact holes in insulative films 3 and 9 and then depositing conductive material (preferabel ITO) into these holes while forming the pixel electrode.

According to the present invention as described above, the manufacture of the TFT of the liquid crystal display device can be accomplished using five mask steps (step of forming the gate, step of forming the active layer, step of forming the source and drain, step of etching the passivation layer and gate insulating film, and step of forming the pixel electrode), while the conventional process requires six or more mask steps. Thus, manufacturing cost can be reduced.

Further, when the source pad is formed from the same material as the source electrode, the contact resistance problem caused when the source pad is in contact with the source electrode can be solved. In addition, since the pixel electrode is formed after forming the passivation layer, processing errors resulting in the pixel electrode contacting the source and drain can be prevented.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A wiring structure comprising:
   a substrate;
   a first conductive layer formed on a first portion of said substrate;
   a first insulative layer formed on a second portion of said substrate and on said first conductive layer;
   a second conductive layer formed on a first portion of said first insulative layer;
   a second insulative layer formed on said second conductive layer and on a second portion of said first insulative layer overlying said first conductive layer;
   an indium tin oxide layer formed on said second insulative layer,
   wherein a first contact hole is provided through said first and second insulative layers to expose part of said first conductive layer and a second contact hole is provided through said second insulative layer to expose part of said second conductive layer, said indium tin oxide layer extends through said first and second contact holes to electrically connect said first conductive layer with said second conductive layer, and
   wherein one of said first and second conductive layers is connected to one of a plurality of terminals of a thin film transistor.

2. A wiring structure comprising:
   a substrate;
   a first conductive layer formed on a portion of said substrate;
   a first insulative layer having a first via hole exposing a portion of said first conductive layer;
   a second conductive layer formed on a portion of said first insulative layer;
   a second insulative layer having a second via hole exposing said exposed portion of the first conductive layer and having a third via hole exposing a portion of the second conductive layer;
   a third conductive layer formed on said second insulative layer and electrically connecting said first conductive layer to said second conductive layer through said first, second, and third via holes,
   wherein one of said first and second conductive layers is connected to one of a plurality of terminals of a thin film transistor.

3. A wiring structure in accordance with claim 2, wherein said third conductive layer includes indium tin oxide.

4. A wiring structure in accordance with claim 2, wherein said first and second via holes constitute a common hole exposing said exposed portion of said first conductive layer, a sidewall of said common hole being substantially smooth.

5. A wiring structure in accordance with claim 2, wherein said second via hole is aligned with said first via hole.

6. A liquid crystal display device comprising:
   a substrate having a primary surface;
   a first conductive layer disposed on a predetermined region of said primary surface;
   a first insulating layer formed overlying said primary surface including said first conductive layer, said first insulating layer including a first contact hole exposing a predetermined portion of said first conductive layer;
   a second conductive layer formed on a predetermined region of said first insulating layer;
   a second insulating layer formed overlying said primary surface including said second conductive layer, said second insulating layer having a second contact hole exposing a predetermined portion of said second conductive layer and said first contact hole region; and
   a third conductive layer formed on said second insulating layer and electrically connected to said first and second conductive layers via said first and second contact holes, wherein one of said first and second conductive layers is connected to one of a plurality of terminals of a thin film transistor.

7. A liquid crystal display device in accordance with claim 6, wherein said third conductive layer includes material suitable for forming a pixel electrode.

8. A method of manufacturing a liquid crystal display device, comprising the steps of:

forming a first conductive layer pattern on a substrate, said first conductive layer pattern being connected to a first terminal of a thin film transistor;

forming a first insulating layer overlying a surface of said substrate including said first conductive layer pattern;

forming a second conductive layer pattern on said first insulating layer, said second conductive layer pattern being connected to a second terminal of the thin film transistor;

forming a second insulating layer overlying said substrate including said second conductive layer pattern;

selectively etching said first and second insulating layers to form a first contact hole and a second contact hole exposing said first conductive layer pattern and said second conductive layer pattern, respectively; and forming a third conductive layer on said second insulating layer, said third conductive layer electrically connected to said first and second conductive layer patterns via said first and second contact holes, respectively.

9. A method of manufacturing a liquid crystal display device in accordance with claim 8, wherein said selective etching step is performed in a single etch step and said third conductive layer includes indium tin oxide.

10. A liquid crystal display device comprising:

a substrate;

a first conductive layer on said substrate including:
  a gate electrode,
  a gate pad, and
  a source pad;

a gate insulating film on said surface of said substrate, a portion of said gate insulating film overlying said gate electrode;

a semiconductor layer on said portion of said gate insulating film;

an impurity-doped semiconductor layer on said semiconductor layer;

a source electrode and a drain electrode on said semiconductor layer;

a passivation layer overlying said source pad, said drain electrode, said gate pad, and said source electrode;

a first contact hole provided through said passivation layer and said gate insulating film exposing said source pad;

a second contact hole provided through said passivation layer exposing said drain electrode;

a third contact hole provided through said passivation layer and said gate insulating film exposing said gate pad;

a fourth contact hole provided through said passivation layer exposing said source electrode;

a pixel electrode electrically connected with said drain electrode via said second contact hole; and a transparent conductive layer electrically connecting said source pad with said source electrode via said first contact hole and said fourth contact hole.

11. A method of manufacturing a liquid crystal display device, comprising the steps of:

forming a first conductive layer on a substrate;

patterning said first conductive layer to form a gate electrode, a gate pad and a source pad;

forming an insulating film on said substrate including said patterned conductive layer;

forming a semiconductor layer on said insulating film;

forming an impurity-doped semiconductor layer on said semiconductor layer;

patterning said impurity-doped semiconductor layer and said semiconductor layer to form an active layer;

forming a second conductive layer overlying said substrate including said active layer;

patterning said second conductive layer to form source electrode and a drain electrode on said active layer;

forming a passivation film overlying said substrate including said source pad, a portion of said drain electrode, said gate pad portion, and a portion of said source electrode;

selectively etching said passivation film and said insulating film to form a first contact hole exposing said source pad, a second contact hole exposing said portion of said drain electrode, a third contact hole exposing said gate pad portion, and a fourth contact hole exposing said portion of said source electrode;

patterning a pixel electrode electrically connected to said drain electrode via said second contact hole;

patterning a first transparent conductive layer electrically connected to said gate pad through said third contact hole; and patterning second transparent conductive layer electrically connecting said source pad to said source electrode via said first and fourth contact holes.

* * * * *

(12) EX PARTE REEXAMINATION CERTIFICATE (7109th)
United States Patent
Shin

(10) Number: US 5,825,449 C1
(45) Certificate Issued: Oct. 20, 2009

(54) LIQUID CRYSTAL DISPLAY DEVICE AND METHOD OF MANUFACTURING THE SAME

(75) Inventor: Woo Sup Shin, Kyungsangbuk-do (KR)

(73) Assignee: LG. Philips LCD Co., Ltd., Youngdungpo-Ku, Seoul (KR)

Reexamination Request:
No. 90/008,737, Jul. 12, 2007
No. 90/010,221, Jul. 17, 2008

Reexamination Certificate for:
Patent No.: 5,825,449
Issued: Oct. 20, 1998
Appl. No.: 08/781,188
Filed: Jan. 10, 1997

Related U.S. Application Data

(62) Division of application No. 08/616,291, filed on Mar. 15, 1996, now abandoned.

(30) Foreign Application Priority Data

Aug. 19, 1995 (KR) ........................ 25538/1995

(51) Int. Cl.
| | |
|---|---|
| H01L 27/12 | (2006.01) |
| H01L 29/417 | (2006.01) |
| H01L 29/40 | (2006.01) |
| H01L 21/84 | (2006.01) |
| H01L 21/70 | (2006.01) |
| G02F 1/13 | (2006.01) |
| G02F 1/1362 | (2006.01) |
| G02F 1/1345 | (2006.01) |

(52) U.S. Cl. .................... 349/148; 349/149; 349/43; 257/E27.11; 257/E29.117

(58) Field of Classification Search ................ 349/148
See application file for complete search history.

(56) References Cited

U.S. PATENT DOCUMENTS

| | | |
|---|---|---|
| 3,825,442 A | 7/1974 | Moore et al. |
| 4,040,073 A | 8/1977 | Luo |
| 4,065,781 A | 12/1977 | Gutknecht |
| 4,330,932 A | 5/1982 | Morris et al. |
| 4,331,758 A | 5/1982 | Luo |
| 4,335,161 A | 6/1982 | Luo |
| 4,389,481 A | 6/1983 | Poleshuk et al. |
| 4,404,731 A | 9/1983 | Poleshuk |
| 4,426,407 A | 1/1984 | Morin et al. |
| 4,461,071 A | 7/1984 | Poleshuk |
| 4,470,667 A | 9/1984 | Okubo et al. |
| 4,509,066 A | 4/1985 | Schachter et al. |
| 4,558,340 A | 12/1985 | Schachter et al. |
| 4,624,737 A | 11/1986 | Shimbo |
| 4,648,691 A | 3/1987 | Oguchi et al. |
| 4,821,092 A | 4/1989 | Noguchi |
| 4,929,569 A | 5/1990 | Yaniv et al. |
| 4,938,567 A | 7/1990 | Chartier |
| 5,003,356 A | 3/1991 | Wakai et al. |
| 5,005,056 A | 4/1991 | Motai et al. |
| 5,032,883 A | 7/1991 | Wakai et al. |
| 5,054,887 A | 10/1991 | Kato et al. |
| 5,075,244 A | 12/1991 | Sakai et al. |
| 5,084,905 A | 1/1992 | Sasaki et al. |
| 5,148,248 A | 9/1992 | Possin et al. |
| 5,153,142 A | 10/1992 | Hsieh |
| 5,160,836 A | 11/1992 | Miyake |

(Continued)

FOREIGN PATENT DOCUMENTS

EP 090 661 12/1987

(Continued)

OTHER PUBLICATIONS

"What is a Preposition?", University of Ottawa Writing Center, Aug. 17, 2008 (http://www.uottawa.ca/academic/arts/writcent/hypergrammar/preposit.html).*

(Continued)

*Primary Examiner*—Albert J Gagliardi

(57) ABSTRACT

A method for fabricating a liquid crystal display is disclosed whereby a source and gate are exposed after the step of forming a passivation layer. As a result, the number of processing steps is reduced and yield is improved.

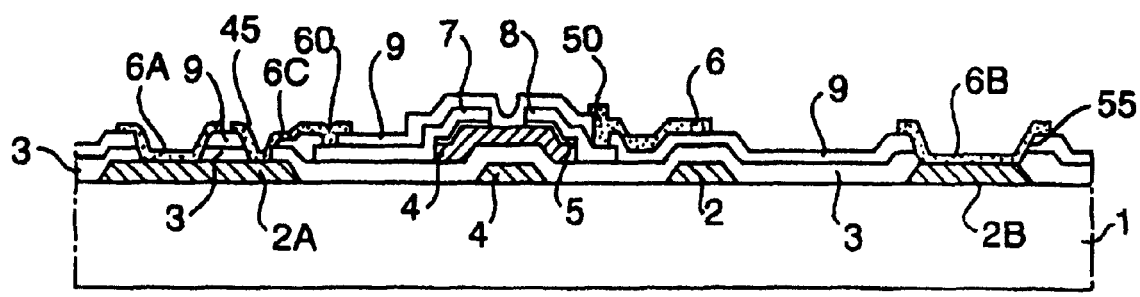

U.S. PATENT DOCUMENTS

| | | | |
|---|---|---|---|
| 5,162,901 A | 11/1992 | Shimada et al. | |
| 5,162,933 A | 11/1992 | Kakuda et al. | |
| 5,166,085 A | 11/1992 | Wakai et al. | |
| 5,166,816 A | 11/1992 | Kaneko et al. | |
| 5,182,661 A | 1/1993 | Ikeda et al. | |
| 5,187,602 A | 2/1993 | Ikeda et al. | |
| 5,187,604 A | 2/1993 | Taniguchi et al. | |
| 5,200,846 A | 4/1993 | Hiroki et al. | |
| 5,200,847 A | 4/1993 | Mawatari et al. | |
| 5,202,572 A | 4/1993 | Kobayashi | |
| 5,202,575 A | 4/1993 | Sakai | |
| 5,208,690 A | 5/1993 | Hayashi et al. | |
| 5,210,045 A | 5/1993 | Possin et al. | |
| 5,229,644 A | 7/1993 | Wakai et al. | |
| 5,233,448 A | 8/1993 | Wu | |
| 5,299,031 A | 3/1994 | Shindoh et al. | |
| 5,317,192 A | 5/1994 | Chen et al. | |
| 5,323,042 A | 6/1994 | Matsumoto | |
| 5,327,001 A | 7/1994 | Wakai et al. | |
| 5,334,859 A | 8/1994 | Matsuda | |
| 5,360,744 A | 11/1994 | Shimizu et al. | |
| 5,363,216 A | 11/1994 | Kim | |
| 5,371,398 A | 12/1994 | Nishihara | |
| 5,376,561 A | 12/1994 | Vu et al. | |
| 5,396,084 A | 3/1995 | Matsumoto | |
| 5,397,719 A | 3/1995 | Kim et al. | |
| 5,414,278 A | 5/1995 | Kobayashi et al. | |
| 5,414,547 A | 5/1995 | Matsuo et al. | |
| 5,418,636 A | 5/1995 | Kawasaki | |
| 5,436,182 A | 7/1995 | Konya et al. | |
| 5,444,019 A | 8/1995 | Chen et al. | |
| 5,446,562 A | 8/1995 | Sato | |
| 5,459,596 A | 10/1995 | Ueda et al. | |
| 5,466,618 A | 11/1995 | Kim | |
| 5,468,987 A | 11/1995 | Yamazaki et al. | |
| 5,475,396 A | * 12/1995 | Kitajima et al. | 345/92 |
| 5,477,073 A | 12/1995 | Wakai et al. | |
| 5,483,082 A | * 1/1996 | Takizawa et al. | 257/59 |
| 5,495,121 A | 2/1996 | Yamazaki et al. | |
| 5,504,376 A | 4/1996 | Sugahara et al. | |
| 5,518,805 A | 5/1996 | Ho et al. | |
| 5,523,257 A | 6/1996 | Yamazaki et al. | |
| 5,523,865 A | 6/1996 | Furuta et al. | |
| 5,523,866 A | 6/1996 | Morimoto et al. | |
| 5,530,265 A | 6/1996 | Takemura | |
| 5,530,568 A | 6/1996 | Yamamoto et al. | |
| 5,532,850 A | 7/1996 | Someya et al. | |
| 5,541,748 A | 7/1996 | Ono et al. | |
| 5,573,958 A | 11/1996 | Fukui et al. | |
| 5,580,792 A | 12/1996 | Zhang et al. | |
| 5,580,796 A | 12/1996 | Takizawa et al. | |
| 5,585,290 A | 12/1996 | Yamamoto et al. | |
| 5,598,012 A | 1/1997 | Hebiguchi | |
| 5,600,461 A | 2/1997 | Ueda et al. | |
| 5,620,905 A | 4/1997 | Konuma et al. | |
| 5,621,556 A | 4/1997 | Fulks et al. | |
| 5,627,084 A | 5/1997 | Yamazaki et al. | |
| 5,642,211 A | 6/1997 | Okano et al. | |
| 5,648,663 A | 7/1997 | Kitahara et al. | |
| 5,648,674 A | 7/1997 | Weisfield et al. | |
| 5,650,636 A | 7/1997 | Takemura et al. | |
| 5,680,190 A | 10/1997 | Michibayashi et al. | |
| 5,682,211 A | 10/1997 | Yao et al. | |
| 5,726,077 A | 3/1998 | Kawahata et al. | |
| 5,734,449 A | 3/1998 | Jang | |
| 5,736,434 A | 4/1998 | Konuma et al. | |
| 5,742,074 A | 4/1998 | Takizawa et al. | |
| 5,792,327 A | 8/1998 | Belscher et al. | |
| 5,807,772 A | 9/1998 | Takemura et al. | |
| 5,814,540 A | 9/1998 | Takemura et al. | |
| 5,825,449 A | 10/1998 | Shin | |
| 5,830,786 A | 11/1998 | Zhang et al. | |
| 5,849,611 A | 12/1998 | Yamazaki et al. | |
| 5,867,242 A | 2/1999 | Yao et al. | |
| 5,879,958 A | 3/1999 | Kawahata et al. | |
| 5,917,221 A | 6/1999 | Takemura | |
| 5,930,607 A | 7/1999 | Satou | |
| 6,052,162 A | 4/2000 | Shimada et al. | |

FOREIGN PATENT DOCUMENTS

| | | |
|---|---|---|
| EP | 0 449 123 | 10/1991 |
| EP | 0 484 965 | 5/1992 |
| EP | 0 312 389 B1 | 12/1995 |
| EP | 0 312 389 | 12/1995 |
| EP | 0 530 834 | 4/1996 |
| EP | 0 530 834 B1 | 12/1996 |
| EP | 0 620 473 | 10/1997 |
| GB | 2 004 994 | 10/1980 |
| GB | 2 253 938 | 9/1992 |
| JP | 56-135968 | 10/1981 |
| JP | 58-190042 | 11/1983 |
| JP | 58-190061 | 11/1983 |
| JP | 59-136971 | 8/1984 |
| JP | S61-79259 | 4/1986 |
| JP | 61080226 | 4/1986 |
| JP | H61-145582 | 7/1986 |
| JP | 62218936 | 9/1987 |
| JP | S62-252171 | 11/1987 |
| JP | 62252964 A * | 11/1987 |
| JP | S62-252964 | 11/1987 |
| JP | S64-28622 | 1/1989 |
| JP | S64-44920 | 2/1989 |
| JP | S64-80046 | 3/1989 |
| JP | H01-101519 | 4/1989 |
| JP | H01-251654 | 10/1989 |
| JP | 01270026 | 10/1989 |
| JP | H01-276766 | 11/1989 |
| JP | 02180076 | 7/1990 |
| JP | H02-212818 | 8/1990 |
| JP | 03129319 A * | 6/1991 |
| JP | 04020935 A | 1/1992 |
| JP | H04-199029 | 7/1992 |
| JP | 04253027 | 9/1992 |
| JP | 04253031 | 9/1992 |
| JP | 04257286 A | 9/1992 |
| JP | 04265945 A | 9/1992 |
| JP | 04295825 | 10/1992 |
| JP | 04299837 A | 10/1992 |
| JP | H04-307521 | 10/1992 |
| JP | H05100249 | 4/1993 |
| JP | H05-241200 | 9/1993 |
| JP | H05-242970 | 9/1993 |
| JP | H05-258861 | 10/1993 |
| JP | 05297410 | 11/1993 |
| JP | H06-85254 | 3/1994 |
| JP | H06-97441 | 4/1994 |
| JP | 06202153 A * | 7/1994 |
| JP | H06-208134 | 7/1994 |
| JP | H06-208137 | 7/1994 |
| JP | 1994-202153 | 7/1994 |
| JP | H06-230420 | 8/1994 |
| JP | 06281957 | 10/1994 |
| JP | H06-291313 | 10/1994 |
| JP | H07-56193 | 12/1994 |
| JP | H06-337436 | 12/1994 |
| JP | H06-337437 | 12/1994 |
| JP | 1995-730085 | 1/1995 |
| JP | 07122755 A * | 5/1995 |
| JP | 07147410 | 6/1995 |
| JP | H07-263700 | 10/1995 |
| KR | 10-0147019 | 5/1998 |

| | | |
|---|---|---|
| KR | 10-0372305 | 2/2003 |
| WO | WO 94/13019 | 6/1994 |

OTHER PUBLICATIONS

One. (2007). In The American Heritage® Dictionary of the English Language. Bostom, MA: Houghton Mifflin. Retrieved Dec. 17, 2008, from http://www.credoreference.com/entry/7108177/.*

Fehlner, Francis P. et al., 32.5: Barrier Layers for Low–Sodium LCD Substrate Glasses, SID 91 Digest, pp. 679–681, Corning Incorporated, Corning, NY.

Kawamura, S., et al., 3–Dimensional SOI/CMOS IC's Fabricated by Beam Recrystalization, IC Development Division, Fujitsu Limited, Kawasaki 211, Japan, IEDM–83, pp. 364–368.

Tilton, Mary, Challenges of manufacturing LCDs from active matrices, Standish Industries Inc., W7514 Hwy V, Lake Mills, WI 53551, SPIE vol. 2174, pp. 181–189.

Powell, Martin, The Physics of Amorphous–Silicon Thin–Film Transistors, IEEE Transactions on Electron Devices, vol. 36, No. 12, Dec. 1989, pp. 2753–2763.

Oritsuki, Ryoji, Geometrical study of the staggered type aSI TFTs structure for low cost AMLCDs process, Electron Tube & Devices Division, Hitachi Ltd., 3300, Hayano Mobara–shi Chiba–ken 297 Japan, pp. 432–435.

Morimoto, H., Current Progress in Manufacturing Process Technologies and Equipment for AMLCDs, Sharp Corp., Tenri, Nara, Japan, Japan Display '92, pp. 337–340.

Itoh, M., et al. High Resolution Low Temperature Poly–Si TFT–LCDs Using a Novel Structure with TFT Capcitors, Sharp Corp., Nara, Japan, SID 96 Digest, pp. 1–6.

Lapp, J.C., A New Substrate for Advanced Flat–Panel–Display Applications, Corning Incorporated, Corning NY, Corning, Japan KK, Shizuoka, Japan, SID 94 Digest, pp. 851–853.

Yuki Masanori, et al., A Full–Color LCD Addressed by Poly–Si TFT's Fabricated Below 450° C, IEEE Transactions on Electron Devices, vol. 36, No. 9, Sep. 1989, pp. 1934–1937.

Glasser, Lance A., et al., The Design and Analysis of VLSI Circuits, 1985, Addison–Wesley Publishing Company, pp. 322–324.

S.G. Chapman & F.A. Huntley, excerpt from "Mesa Thin Film Transistor," IBM Technical Disclosure Bulletin, vol. 21, No. 4, abstract & Figs. 1–3, 2 pgs. (Sep. 1978).

P.K. Deka et al., CdS Thin Transistor With $Pr_6O_{11}$ as the Gate Oxide, Thin Solid Films, vol. 112, No. 1 (Feb. 1984), p. L5–L8.

Foshee et al., "The Development of Thin–Film Active Devices Using a Subtractive Fabrication Process," Conference Proceedings of IEEE Southeastcon (1980), p. 155–156.

T. Kallfass, "Improvement of Adhesion, Line Definition, Contact Resistance and Semiconductor Properties by Sputter–Etching," ElectroComponent Science and Technology, vol. 5 (1979), p. 215–218.

S. Kawai et al., "Amorphous Silicon Thin–Film Transistor for Liquid Crystal Display Panel," SID International Symposium Digest of Technical Papers, (1$^{st}$ ed. May 1982), p. 42–43.

S. Kawai et al., "A Self–Alignment Processed a Si:H TFT Matrix Circuit for LCD Panels," Proceedings of the Society for Information Display, Selected Papers from the 1983 SID International Symposium, vol. 25 No. 1 (1984), p. 144–145.

T. Kodama et al., "A Self–Alignment Process for Amorphous Silicon Thin Transistors," IEEE Electron Device Letters, vol. EDL–3, No. 7 (Jul. 1982), p. 187–189.

P.G. Comber et al., "Amorphous–Silicon Field Effect Device and Possible Application," Electronics Letters vol. No. 6 (Mar. 15, 1979), pp. 179–181.

P.G. LeComber et al., "Applications of a–Si Field–Effect Transistors in Liquid Crystal Displays and in Integrated Logic Circuits" Journal De Physique, pp. C4–423 to C4–432, in Proceedings of the Ninth International Conference on Amorphous and Liquid Semiconductors (1981).

P.G. Comber et al., "The Development of the a–Si:H Field Effect Transistor and its Possible Applications", Semiconductors and Semimetals, vol. 21, Part D (1984), p. 89–113.

Fang–Chen Luo, "Applications of CdSe Thin Film Transistors in Flat Panel Displays," Comparison of Thin Film Transistor and SOI Technologies, Materials Research Society Symposia Proceedings, vol. 33. (1984), p. 239–245.

K.D. McKenzie et al. "The Characteristics and Properties of Optimised Amorphous Silicon Field Effect Transistors," Applied Physics A, Solids and Surfaces, vol. A31 (1983), p. 87–92.

Y. Okubo et al., "Large–Scale LCDs Addressed by a–Si TFT Array," SID International Symposium Digest of Technical Papers (1$^{st}$ ed. May 1982), p. 40–41.

M.J. Powell et al., "Amorphous Silicon–Silicon Nitride Thin–Film Transistors," Applied Physics Letters, vol. 38, No. 10 (May 15, 1981), p. 794–796.

M.J. Powell, "Instability Mechanisms in Amorphous Silicon–Silicon Nitride Thin Film Transistors," Insulating Films on Semiconductors (J.F. Verweig and D.R. Wolters eds., 1983); pp. 245–251.

M.J. Powell, "Material Properties Controlling the Performance of Amorphous Silicon Thin Film Transistors," in Comparison of Thin Film Transistor and SOI Technologies, Materials Research Society Symposia Proceedings, vol. 33. (1984), p. 259–273.

A.J. Snell et al., "Applications of Amorphous Silicon Field Effect Transistors in Addressable Liquid Crystal Display Panels," Applied Physics vol. 24 No. 4 (Apr. 1981), pp. 357–362.

A.J. Snell et al., Application of Amorphous Silicon Field Effect Transistors in Integrated Circuits, Applied Physics A Solids And Surfaces vol. A26 No. 2 (Oct. 1981), pp. 83–86.

W.E. Spear et al., Chapter 3: "Fundamentals and Applied Work on Glow Discharge Material", in the Physics of Hydrogenated Amorphous Silicon I, Springer–Verlag (J.D. Joannopoulos and G. Lucovsky eds., 1984), pp. 64–118.

H.C. Tuan et al., "Dual–Gate a–Si H Thin Film Transistors," IEEE Electron Device Letters, vol. EDL–3, No. 12 (Dec. 1982), p. 357–359.

Counterclaimant CPT's Supplemental Responses to Counterclaim Defendant LG.Philips LCD CO., Ltd.'s Second Set of Interrogatories (Nos. 10–11).

CPT's Objections and Responses to LG.Philips LCD Co., Ltd.s First Set of Interrogatories (Nos. 1–10).

CPT's Objections and Supplemental Responses to LG.Philips LCD Co., Ltd.'s First Set of Interrogatories (Nos. 4,5, and 10).

CPT's Objections and Third Supplemental Response to LG.Philips LCD CO. Ltd's First Set of Interrogatories (No. 5).

LPL's Supplemental Responses to CPT's Interrogatories Nos. 13 and 14.
Woo Sup Shin Trial Testimony (Oct. 19, 2006).
Expert Report of Roger Stewart Re: Invalidity of U.S. Patent No. 5,825,449.
Rebuttal Expert Report of Dr. Gary Rubloff on U.S. Pat. Nos. 4,624,737 and 5,825,449.
Dr. Stuarts Trial Testimony on the Invalidity of the '449 Patent—Reporter's Transcript of Trial Proceedings Nov. 7, 2007.
Order Re Claim Construction—May 5, 2005.
LPL's Opening Claim Construction Brief.
LPL's Responsive Claim Construction Brief.
CPT's Opening Brief in Support of Their Proposed Claim Constructions.
CPT's Responsive Claim Construction Brief.
Second Revised Joint Claim Construction Statement.
LPL's Responses to CPT's Sixth Set of Requests for Admissions (615–700).
CPT's Notice of Motion and Motion for New Trial.
LPL's Opposition to CPT's Renewed Motion for Judgment as a Matter of Law.
Deposition Transcript of Rubloff (Oct. 31, 2005).
Satoru Kawai et al., "Amorphous Silicon Thin–Film Transistor for Liquid Crystal Display Panel," SID 82 Digest, pp. 42–43.
M.J. Powell, "Instability Mechanisms in Amorphous Silicon—Silicon Nitride Thin Film–Transistors," Insulating Films on Semiconductors, 1983, pp. 245–251.

* cited by examiner

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 10 and 11 is confirmed.

Claims 1, 2, 6, 8 and 9 are determined to be patentable as amended.

Claims 3, 4, 5 and 7, dependent on an amended claim, are determined to be patentable.

New claims 12–21 and 22 are added and determined to be patentable.

1. A wiring structure comprising:
a substrate;
a first conductive layer *including a gate electrode* formed on a first portion of said substrate;
a first insulative layer formed on a second portion of said substrate and on said first conductive layer;
a second conductive layer formed on a first portion of said first insulative layer;
a second insulative layer formed on said second conductive layer and on a second portion of said first insulative layer overlying said first conductive layer;
an indium tin oxide layer formed on said second insulative layer,
wherein a first contact hole is provided through said first and second insulative layers to expose part of said first conductive layer and a second contact hole is provided through said second insulative layer to expose part of said second conductive layer, said indium tin oxide layer extends through said first and second contact holes to electrically connect said first conductive layer with said second conductive layer, and
wherein *only* one of said first and second conductive layers is *directly* connected to one of a plurality of terminals of a thin film transistor.

2. A wiring structure comprising:
a substrate;
a first conductive layer *including a gate electrode* formed on a portion of said substrate;
a first insulative layer having a first via hole exposing a portion of said first conductive layer;
a second conductive layer formed on a portion of said first insulative layer;
a second insulative layer having a second via hole exposing said exposed portion of the first conductive layer and having a third via hole exposing a portion of the second conductive layer;
a third conductive layer formed on said second insulative layer and electrically connecting said first conductive layer to said second conductive layer through said first, second, and third via holes,
wherein *only* one of said first and second conductive layers is *directly* connected to one of a plurality of terminals of a thin film transistor.

6. A liquid crystal display device comprising:
a substrate having a primary surface;
a first conductive layer *including a gate electrode* disposed on a predetermined region of said primary surface;
a first insulating layer formed overlying said primary surface including said first conductive layer, said first insulating layer including a first contact hole exposing a predetermined portion of said first conductive layer;
a second conductive layer formed on a predetermined region of said first insulating layer;
a second insulating layer formed overlying said primary surface including said second conductive layer, said second insulating layer having a second contact hole exposing a predetermined portion of said second conductive layer and said first contact hole region; and
a third conductive layer formed on said second insulating layer and electrically connected to said first and second conductive layers via said first and second contact holes,
wherein *only* one of said first and second conductive layers is *directly* connected to one of a plurality of terminals of a thin film transistor.

8. A method of manufacturing a liquid crystal display device *having an array of pixels*, comprising the steps of:
forming a first conductive layer pattern on a substrate, *said first conductive layer pattern including a gate line and a conductive element*, said first conductive layer pattern *except said conductive element* being connected to a [first] *gate* terminal of a thin film transistor;
forming a first insulating layer overlying a surface of said substrate including said first conductive layer pattern;
forming a second conductive layer pattern on said first insulating layer, *said second conductive layer pattern including a source wiring, said source wiring of* said second conductive layer pattern being connected to a [second] *source* terminal of the thin film transistor, *wherein said conductive element of the first conductive layer pattern is outside said array of pixels*;
forming a second insulating layer overlying said substrate including said second conductive layer pattern;
selectively etching said first and second insulating layers to form a first contact hole and a second contact hole exposing said *conductive element of the* first conductive layer pattern and said second conductive layer pattern, respectively; and
forming a third conductive layer *pattern* on said second insulating layer, said third conductive layer *pattern* electrically connected to said *conductive element of the* first *conductive layer pattern* and *said* second conductive layer [patterns] *pattern* via said first and second contact holes, respectively, *wherein said conductive element of the first conductive layer pattern is electrically connected to said second conductive layer pattern through said third conductive layer pattern*.

9. A method of manufacturing a liquid crystal display device in accordance with claim 8, wherein said selective etching step is performed in a single etch step and said third conductive layer *pattern* includes indium tin oxide.

*12. A method of manufacturing a liquid crystal display device in accordance with claim 8, wherein the conductive element is a source pad.*

13. A method of manufacturing a liquid crystal display device in accordance with claim 8, wherein the first conductive layer pattern includes a plurality of conductive elements and the second conductive layer pattern includes a plurality of source wirings, each of said plurality of conductive elements being electrically connected to one of the plurality of source wirings through the third conductive layer pattern.

14. A method of manufacturing a liquid crystal display device in accordance with claim 8, wherein the first conductive layer pattern further includes a gate pad connected to the gate line.

15. A method of manufacturing a liquid crystal display device in accordance with claim 12, wherein the source wiring does not overlap with the source pad.

16. A method of manufacturing a liquid crystal display device in accordance with claim 8, wherein the third conductive layer pattern contacts the first insulating layer, the second insulating layer, the source wiring and the conductive element.

17. A method of manufacturing a liquid crystal display device in accordance with claim 8, wherein the third conductive layer pattern contacts at least two different areas of the conductive element.

18. A method of manufacturing a liquid crystal display device in accordance with claim 8, wherein the first insulating layer is directly on the first conductive layer pattern.

19. A method of manufacturing a liquid crystal display device in accordance with claim 8, wherein the second insulating layer is directly on the second conductive layer pattern.

20. A wiring structure according to claim 1, wherein the substrate includes glass and the first conductive layer including the gate electrode is directly on the glass.

21. A wiring structure according to claim 2, wherein the substrate includes glass and the first conductive layer including the gate electrode is directly on the glass.

22. A wiring structure according to claim 6, wherein the substrate includes glass and the first conductive layer including the gate electrode is directly on the glass.

* * * * *

(12) EX PARTE REEXAMINATION CERTIFICATE (8422nd)
United States Patent
Shin

(10) Number: US 5,825,449 C2
(45) Certificate Issued: Jul. 19, 2011

(54) METHOD AND APPARATUS FOR CONTROLLING RAPID DISPLAY OF MULTIPLE IMAGES FROM A DIGITAL IMAGE DATABASE

(75) Inventor: Woo Sup Shin, Kyungsangbuk-do (KR)

(73) Assignee: LG Display Co., Ltd., Yoido-Dong, Youngdungpo-Gun, Seoul (KR)

Reexamination Request:
No. 90/009,550, Sep. 17, 2009

Reexamination Certificate for:
Patent No.: 5,825,449
Issued: Oct. 20, 1998
Appl. No.: 08/781,188
Filed: Jan. 10, 1997

Reexamination Certificate C1 5,825,449 issued Oct. 20, 2009

Related U.S. Application Data

(62) Division of application No. 08/616,291, filed on Mar. 15, 1996, now abandoned.

(51) Int. Cl.
| | |
|---|---|
| *H01L 27/12* | (2006.01) |
| *H01L 29/417* | (2006.01) |
| *H01L 21/84* | (2006.01) |
| *H01L 21/70* | (2006.01) |
| *G02F 1/1362* | (2006.01) |
| *G02F 1/1345* | (2006.01) |

(52) U.S. Cl. .................. 349/148; 257/E27.111; 257/E29.117; 349/149; 349/43

(58) Field of Classification Search .................. None
See application file for complete search history.

(56) References Cited

U.S. PATENT DOCUMENTS

| | | | |
|---|---|---|---|
| 5,334,859 | A | 8/1994 | Matsuda |
| 5,475,396 | A | 12/1995 | Kitajima et al. |
| 5,483,082 | A | 1/1996 | Takizawa et al. |
| 5,621,556 | A | 4/1997 | Fulks et al. |
| 5,648,674 | A | 7/1997 | Weisfield et al. |
| 5,726,077 | A | 3/1998 | Kawahata et al. |
| 5,867,242 | A | 2/1999 | Yao et al. |

FOREIGN PATENT DOCUMENTS

| | | |
|---|---|---|
| JP | S62-252171 | 11/1987 |
| JP | S62-252964 | 11/1987 |
| JP | S64-28622 | 1/1989 |
| JP | S64-44920 | 2/1989 |
| JP | H01-101519 | 4/1989 |
| JP | H04-199029 | 7/1992 |
| JP | H04-307521 | 10/1992 |
| JP | H06-85254 | 3/1994 |
| JP | H07-30085 | 1/1995 |

OTHER PUBLICATIONS

The Physics of Amorphous–Silicon Thin Film Transistors, IEEE Transactions on Electron Devices, vol. 36, No. 12, pp. 2753–2763 (Dec. 1989) by Martin J. Powell ("Powell"). The Powell paper was published in 1989.
Geometrical Study of the Staggered Type a–Si TFTs Structure for Low Cost AMLCDs Process, Conference Record of the 1994 International Display Research Conference, pp. 432–435 by Ryoji Oritsuki ("Oritsuki"). The Oritsuki paper was published in 1994.

*Primary Examiner* — Anjan K. Deb

(57) ABSTRACT

A method for fabricating a liquid crystal display is disclosed whereby a source and gate are exposed after the step of forming a passivation layer. As a result, the number of processing steps is reduced and yield is improved.

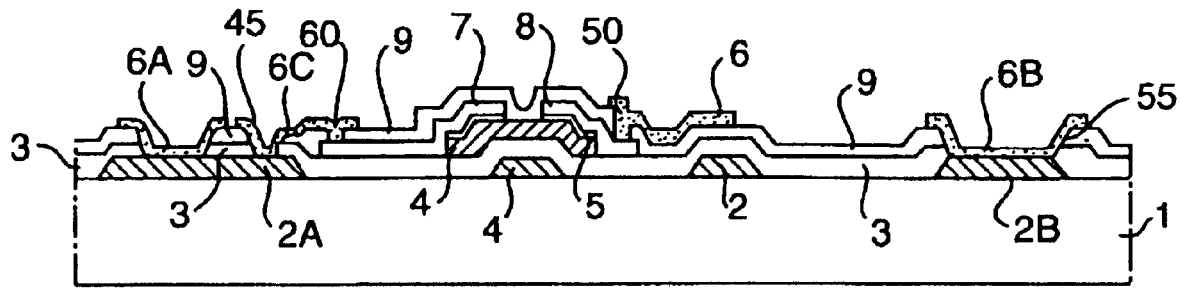

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 10 and 11 is confirmed.

Claims 1, 2, 6 and 8 are determined to be patentable as amended.

Claims 3-5, 7, 9 and 12-22, dependent on an amended claim, are determined to be patentable.

1. A wiring structure comprising:
a substrate;
a first conductive layer [including] *and* a gate electrode *on said substrate, the first conductive layer being* formed on a first portion of said substrate;
a first insulative layer formed on a second portion of said substrate and on said first conductive layer;
a second conductive layer formed on a first portion of said first insulative layer;
a second insulative layer formed on said second conductive layer and on a second portion of said first insulative layer overlying said first conductive layer;
an indium tin oxide layer formed on said second insulative layer,
wherein a first contact hole is provided through said first and second insulative layers to expose part of said first conductive layer and a second contact hole is provided through said second insulative layer to expose part of said second conductive layer, said indium tin oxide layer extends through said first and second contact holes to electrically connect said first conductive layer with said second conductive layer, and
wherein only one of said first and second conductive layers is directly connected to one of a plurality of terminals of a thin film transistor.

2. A wiring structure comprising:
a substrate;
a first conductive layer [including] *and* a gate electrode *on the substrate, the first conductive layer being* formed on a portion of said substrate;
a first insulative layer having a first via hole exposing a portion of said first conductive layer;
a second conductive layer formed on a portion of said first insulative layer;
a second insulative layer having a second via hole exposing said exposed portion of the first conductive layer and having a third via hole exposing a portion of the second conductive layer;
a third conductive layer *of a transparent conductive material* formed on said second insulative layer and electrically connecting said first conductive layer to said second conductive layer through said first, second, and third via holes,
wherein only one of said first conductive and second conductive layers is directly connected to one of a plurality of terminals of a thin film transistor.

6. A liquid crystal display device comprising:
a substrate having a primary surface;
a first conductive layer [including] *and* a gate electrode *on the substrate, the first conductive layer being* disposed on a predetermined region of said primary surface;
a first insulating layer formed overlying said primary surface including said first conductive layer, said first insulating layer including a first contact hole exposing a predetermined portion of said first conductive layer;
a second conductive layer formed on a predetermined region of said first insulating layer;
a second insulating layer formed overlying said primary surface including said second conductive layer, said second insulating layer having a second contact hole exposing a predetermined portion of said second conductive layer and said first contact hole region; and
a third conductive layer *of a transparent conductive material* formed on said second insulating layer and electrically connected to said first *conductive layer* and second conductive [layers] *layer* via said first and second contact holes,
wherein only one of said first conductive and second conductive layers is directly connected to one of a plurality of terminals of a thin film transistor.

8. A method of manufacturing a liquid crystal display device having an array of pixels, comprising the steps of:
forming a first conductive layer pattern on a substrate, said first conductive layer pattern including a gate line and a conductive element, said first conductive layer pattern except said conductive element being connected to a gate terminal of a thin film transistor;
forming a first insulating layer overlying a surface of said substrate including said first conductive layer pattern;
forming a second conductive layer pattern on said first insulating layer, said second conductive layer pattern including a source wiring, said source wiring of said second conductive layer pattern being connected to a source terminal of the thin film transistor, wherein said conductive element of the first conductive layer pattern is outside said array of pixels;
forming a second insulating layer overlying said substrate including said second conductive layer pattern;
selectively etching said first and second insulating layers to form a first contact hole and a second contact hole exposing said conductive element of the first conductive layer pattern and said second conductive layer pattern, respectively; and
forming a third conductive layer pattern *of a transparent conductive material* on said second insulating layer, said third conductive layer pattern electrically connected to said conductive element of the first conductive layer pattern and said second conductive layer pattern via said first and second contact holes, respectively, wherein said conductive element of the first conductive layer pattern is electrically connected to said second conductive layer pattern through said third conductive layer pattern.

* * * * *